(12) United States Patent
Cho et al.

(10) Patent No.: US 7,998,357 B2
(45) Date of Patent: Aug. 16, 2011

(54) METHOD OF FINE PATTERNING SEMICONDUCTOR DEVICE

(75) Inventors: Nam-Myun Cho, Seoul (KR);
Myeong-Cheol Kim, Suwon (KR);
Shi-Yong Yi, Seongham (KR);
Young-Hoon Song, Seoul (KR);
Young-Ju Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 661 days.

(21) Appl. No.: 12/217,782

(22) Filed: Jul. 9, 2008

(65) Prior Publication Data
US 2009/0246966 A1    Oct. 1, 2009

(30) Foreign Application Priority Data
Mar. 28, 2008    (KR) ................ 10-2008-0029329

(51) Int. Cl.
*B44C 1/22* (2006.01)
*C03C 15/00* (2006.01)
*C03C 25/68* (2006.01)
*C23F 1/00* (2006.01)

(52) U.S. Cl. ............... 216/47; 216/41; 216/46; 438/689
(58) Field of Classification Search .................... 216/41, 216/46, 47; 438/689
See application file for complete search history.

(56) References Cited

U.S. PATENT DOCUMENTS

| | | | |
|---|---|---|---|
| 6,475,891 B2 | 11/2002 | Moon | 438/584 |
| 7,115,525 B2 | 10/2006 | Abatchev et al. | 438/725 |
| 7,253,118 B2 | 8/2007 | Tran et al. | 438/717 |
| 2006/0046484 A1 * | 3/2006 | Abatchev et al. | 438/689 |

* cited by examiner

*Primary Examiner* — Roberts Culbert
(74) *Attorney, Agent, or Firm* — Monica H. Choi

(57) ABSTRACT

For integrated circuit fabrication, at least one spacer support structure is formed in a first area over a semiconductor substrate, and a mask material is deposited on exposed surfaces of the spacer support structure and on a second area over the semiconductor substrate. A masking structure is formed on a portion of the mask material in the second area, and the mask material is patterned to form spacers on sidewalls of the spacer support structure and to form a mask pattern under the masking structure. The spacer support structure and the masking structure are comprised of respective high carbon content materials that have been spin-coated and have substantially a same etch selectivity.

25 Claims, 11 Drawing Sheets

METHOD OF FINE PATTERNING SEMICONDUCTOR DEVICE

CLAIM TO PRIORITY

This application claims priority under 35 USC §19 to Korean Patent Application No. 10-2008-0029329, filed on Mar. 28, 2008 in the Korean Intellectual Property Office, the disclosure of which is incorporated herein in its entirety by reference.

TECHNICAL FIELD

The present invention relates generally to integrated circuit fabrication, and more particularly, to methods of fine patterning semiconductor devices.

BACKGROUND OF THE INVENTION

Integrated circuit (IC) dimensions are desired to be constantly scaled down with advancement of technology. Integrated circuits are traditionally patterned according to photolithography technology. However, photolithography technology is reaching limitations for achieving such ever smaller (IC) dimensions into the nanometers range.

For example, line resolution and line edge roughness are limited by the large size of polymer molecules of photo-resist material. In addition, a photo-resist structure that is tall and thin is prone to pattern collapse.

Accordingly, SADP (self-aligned double patterning) technology has emerged to achieve smaller IC dimensions as illustrated in FIGS. 1A, 1B, 1C, 1D, 1E, and 1F. Referring to FIG. 1A, a target layer 102 to be patterned is formed on a semiconductor substrate 104 such as a silicon substrate. A first mask pattern 106 having a first pitch is formed on the target layer 102. Thereafter in FIG. 1B, a layer of spacer material 108 is deposited on exposed surfaces including sidewalls and top surfaces of the first mask pattern 106.

Subsequently referring to FIG. 1C, the spacer material 108 is anisotropically etched to form spacers 110 from the spacer material 108 remaining at sidewalls of the first mask pattern 106. Thereafter referring to FIG. 1D, a second mask material 112 is blanket deposited to fill in the spaces between the spacers 110. Further in FIG. 1E, the second mask material 112 is etched down until the second mask material 112 remaining between the spacers 110 form a second mask pattern 114. Subsequently in FIG. 1F, the spacers 110 are removed such that a final mask pattern is formed from the first and second mask patterns 106 and 114. Such a final mask pattern 106 and 114 is used to pattern the target layer 102 with a pitch that is twice the pitch of the first mask pattern 106 alone or twice the pitch of the second mask pattern 114 alone.

Referring to FIG. 2 for SARP (self-aligned reverse patterning) technology, subsequently after the spacers 110 are formed in FIG. 1C, the first mask pattern 106 is etched away such that just the spacers 110 remain. The remaining spacers 110 are used as the final mask pattern for patterning the target layer 102. Such a final mask pattern 110 has a pitch that is twice the pitch of the first mask pattern 106.

However, such SADP or SARP technology of the prior art has high production cost, long production time, and void formation in openings with high aspect ratio. In addition, simultaneous patterning of integrated circuit structures with different densities on different areas of a semiconductor substrate is desired.

SUMMARY OF THE INVENTION

Accordingly, in a method of patterning during integrated circuit fabrication, the method includes forming at least one spacer support structure in a first area over a semiconductor substrate, and depositing a mask material on exposed surfaces of the spacer support structure and on a second area over the semiconductor substrate. In addition, a masking structure is formed on a portion of the mask material in the second area, and the mask material is patterned to form spacers on sidewalls of the spacer support structure and to form a mask pattern under the masking structure. The spacer support structure and the masking structure are comprised of respective materials having a substantially same etch selectivity.

For example, the spacer support structure and the masking structure are comprised of a substantially same material. In an embodiment of the present invention, the spacer support structure and the masking structure are each comprised of a respective high carbon content material having from about 85 weight percent to about 99 weight percent of carbon.

In another embodiment of present invention, the spacer support structure and the masking structure are etched away during one etch process. Additionally, at least one target layer is patterned using the spacers and the mask pattern.

Alternatively, at least one hard-mask layer is patterned using the spacers and the mask pattern to form a hard-mask pattern. In that case, at least one target layer is patterned using the hard-mask pattern.

In one embodiment of the present invention, the at least one target layer includes the semiconductor substrate or a conductive material.

In an example embodiment of the present invention, the step of forming the at least one spacer support structure includes spin-coating an organic compound material over the semiconductor substrate. The organic compound material is heated at a temperature of from about 150° Celsius to about 350° Celsius for about 60 seconds. In addition, the organic compound material is further heated at a temperature of from about 300° Celsius to about 550° Celsius for from about 30 seconds to about 300 seconds to form a hardened organic compound layer.

Subsequently, the hardened organic compound layer is patterned over the first area to form the at least one spacer support structure. For example, the hardened organic compound layer is patterned with a photo-resist pattern to form the at least one spacer support structure.

In another embodiment of the present invention, the step of forming the masking structure includes spin-coating an organic compound material on the mask material. The organic compound material is heated at a temperature of from about 150° Celsius to about 350° Celsius for about 60 seconds. In addition, the organic compound material is further heated at a temperature of from about 300° Celsius to about 550° Celsius for from about 30 seconds to about 300 seconds to form a hardened organic compound layer.

Subsequently, the hardened organic compound layer is patterned over the second area to form the masking structure. For example, the hardened organic compound layer is patterned with a photo-resist pattern to form the masking structure.

In an example embodiment of the present invention, the first area of the semiconductor substrate is for fabricating an array of memory cells of a memory device, and the second area of the semiconductor substrate forms a periphery area of the memory device.

In a method of patterning during integrated circuit fabrication according to another aspect of the present invention, at least one spacer support structure is formed in a first area over a semiconductor substrate, and a mask material is deposited on exposed surfaces of the spacer support structure and on a second area over the semiconductor substrate. Additionally, a masking structure is formed on a portion of the mask material in the second area, and the mask material is patterned to form spacers on sidewalls of the spacer support structure and to form a mask pattern under the masking structure. At least one of the spacer support structure and the masking structure is formed from spin-coating a respective material.

In an embodiment of the present invention, the spacer support structure and the masking structure are each comprised of a respective high carbon content material having from about 85 weight percent to about 99 weight percent of carbon.

In an example embodiment of the present invention, the step of forming the at least one spacer support structure includes spin-coating an organic compound material over the semiconductor substrate. The organic compound material is heated at a temperature of from about 150° Celsius to about 350° Celsius for about 60 seconds. Additionally, the organic compound material is further heated at a temperature of from about 300° Celsius to about 550° Celsius for from about 30 seconds to about 300 seconds to form a hardened organic compound layer.

Subsequently, the hardened organic compound layer is patterned over the first area to form the at least one spacer support structure. For example, the hardened organic compound layer is patterned with a photo-resist pattern to form the at least one spacer support structure.

In a further embodiment of the present invention, the step of forming the masking structure includes spin-coating an organic compound material on the mask material. The organic compound material is heated at a temperature of from about 150° Celsius to about 350° Celsius for about 60 seconds. The organic compound material is further heated at a temperature of from about 300° Celsius to about 550° Celsius for from about 30 seconds to about 300 seconds to form a hardened organic compound layer.

Subsequently, the hardened organic compound layer is patterned over the second area to form the masking structure. For example, the hardened organic compound layer is patterned with a photo-resist pattern to form the masking structure.

In this manner, the spacers are used as an etch mask for patterning the target layer with higher density in the first area. In addition, the mask pattern is used as an etch mask for patterning the target layer with lower density in the second area. Advantageously, the target layer may be patterned to form integrated circuit structures with different densities simultaneously.

In addition, the spacer support structures and the masking structure are comprised of a same high carbon content material for being simultaneously etched away with ease from one ashing and stripping process. Furthermore, such high carbon content materials are formed by spin-coating for reduced void formation.

These and other features and advantages of the present invention will be better understood by considering the following detailed description of the invention which is presented with the attached drawings.

The figures referred to herein are drawn for clarity of illustration and are not necessarily drawn to scale. The same reference number in FIGS. 1A, 1B, 1C, 1D, 1E, 1F, 2, 3A, 3B, 3C, 3D, 3E, 3F, 3G, 3H, 3I, 3J, 3K, 3L, 4A, 4B, 4C, 4D, 4E, 4F, 4G, 5, and 6 refer to elements having similar structure and/or function.

DETAILED DESCRIPTION

Figure 1A:
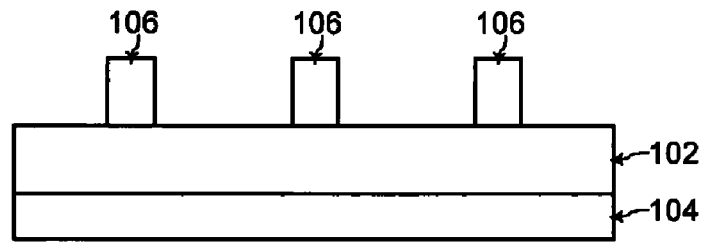
FIGS. 1A, 1B, 1C, 1D, 1E, and 1F show cross-sectional views during SADP (self-aligned double patterning), according to the prior art.
Figure 1B:
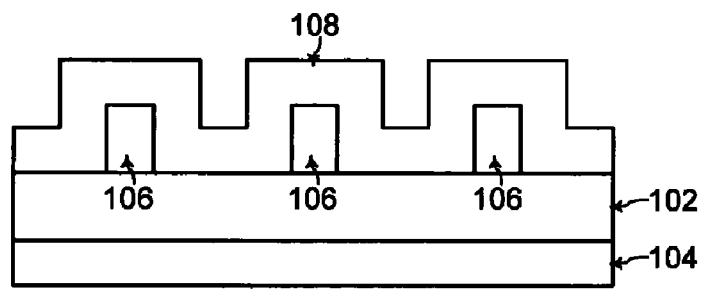
Figure 1C:
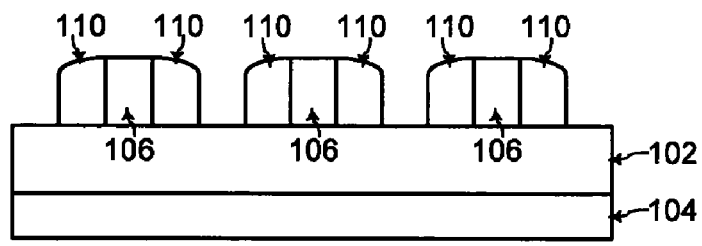
Figure 1D:
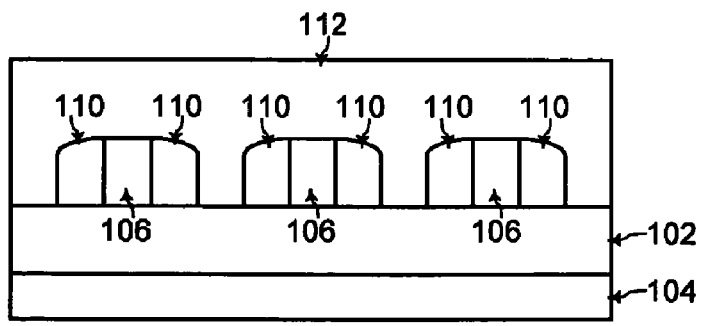
Figure 1E:
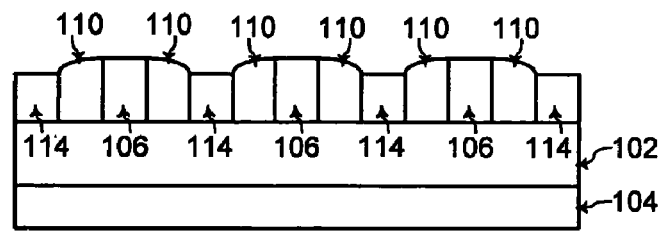
Figure 1F:
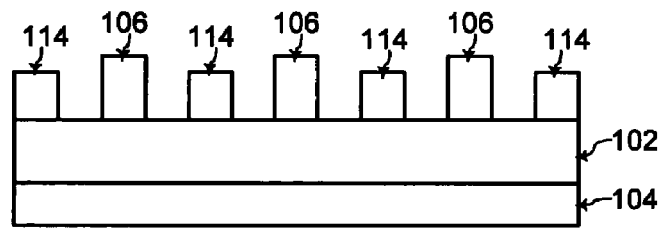
Figure 2:
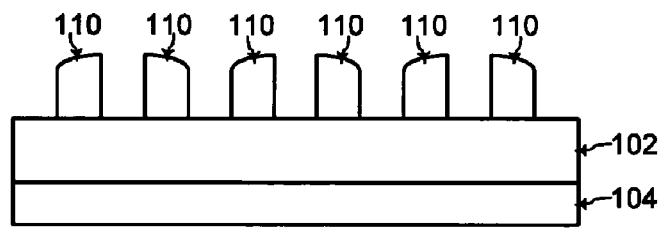
FIG. 2 shows a cross-sectional view during SARP (self-aligned reverse patterning), according to the prior art.
Figure 3A:
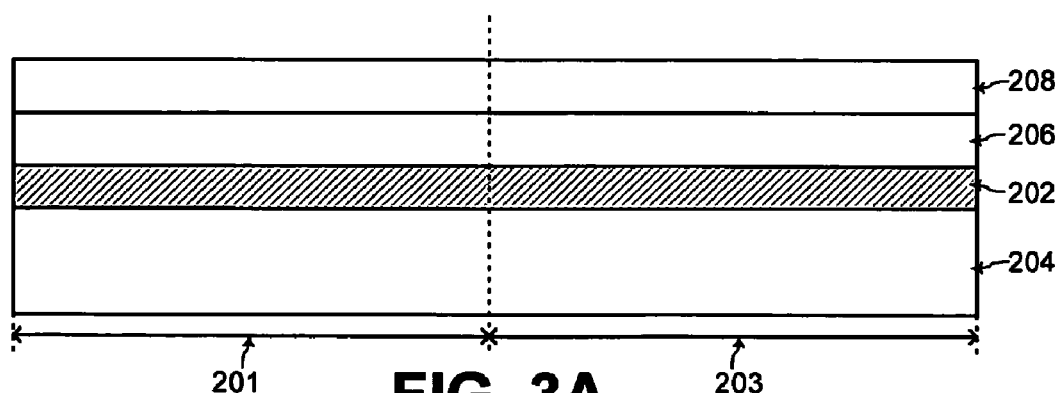
FIGS. 3A, 3B, 3C, 3D, 3E, 3F, 3G, 3H, 3I, 3J, 3K, and 3L show cross-sectional views during patterning a target layer using spacers and a mask pattern formed with use of spin-coated high carbon content materials, according to a first embodiment of the present invention.

FIGS. 3A, 3B, 3C, 3D, 3E, 3F, 3G, 3H, 3I, 3J, 3K, and 3L show cross-sectional views for patterning a target layer 202 using spacers and a mask pattern formed with use of spin coated high carbon content materials, according to a first embodiment of the present invention Referring to FIG. 3A, a target layer 202 is deposited on a semiconductor substrate 204 such as a silicon substrate for example. The target layer 202 may be comprised of a conductive material such as doped polysilicon or a stack of doped polysilicon and a metal silicide for patterning gate electrodes from the target layer 202. Alternatively, the target layer 202 may be comprised of a metal such as tungsten or aluminum or a metal alloy for patterning a bit line from the target layer 202. The present invention may also be practiced with the target layer 202 being omitted when the substrate 204 is desired to be patterned.

Further referring to FIG. 3A, a first hard mask layer 206 is formed on the target layer 202. The first hard mask layer 206 and the target layer 202 are comprised of respective materials having different etch selectivities with respect to a predetermined etch solution or a predetermined etch gas.

Also referring to FIG. 3A, a second hard mask layer 208 is formed on the first hard mask layer 206. The first hard mask layer 206 and the second hard mask layer 208 are comprised of respective materials having different etch selectivities with respect to a predetermined etch solution or a predetermined etch gas.

For example, the first hard mask layer 206 is comprised of an oxide such as one of a plasma enhanced oxide (PEOX), a thermal oxide, a chemical vapor deposition (CVD) oxide, an undoped silicate glass (USG), or a high density plasma (HDP) oxide. In that case, the second hard mask layer 208 is comprised of a nitride such as silicon oxynitride (SiON), silicon nitride (SiN), silicon boron nitride (SiBN), or boron nitride (BN), for example.

Alternatively, the present invention may also be practiced with just one of the first and second hard mask layers 206 and 208. In that case, the present invention is practiced with one of the first and second hard mask layers 206 and 208 being omitted.

Further referring to FIG. 3A, the semiconductor substrate 204 has a first area 201 for forming integrated circuit structures with higher density such as an array of memory cells of a memory device. Also in FIG. 3A, the semiconductor substrate 204 has a second area 203 for forming integrated circuit structures with lower density such as a periphery area having logic circuitry for the memory device.

Subsequently referring to FIG. 3B, a first spin-coated layer 210 which may also be termed a first mold layer is formed on the second hard mask layer 208. In an example embodiment of the present invention, the first spin-coated layer 210 is comprised of a hydrocarbon compound including an aromatic ring or an organic compound comprising a derivative thereof. For example, the first spin-coated layer 210 is comprised of an organic compound having an aromatic ring such as phenyl, benzene, or naphthalene. In any case, the first spin-coated layer 210 is comprised of a high carbon containing material having from about 85% to about 99% weight percent of carbon, according to an example embodiment of the present invention.

Figure 5:
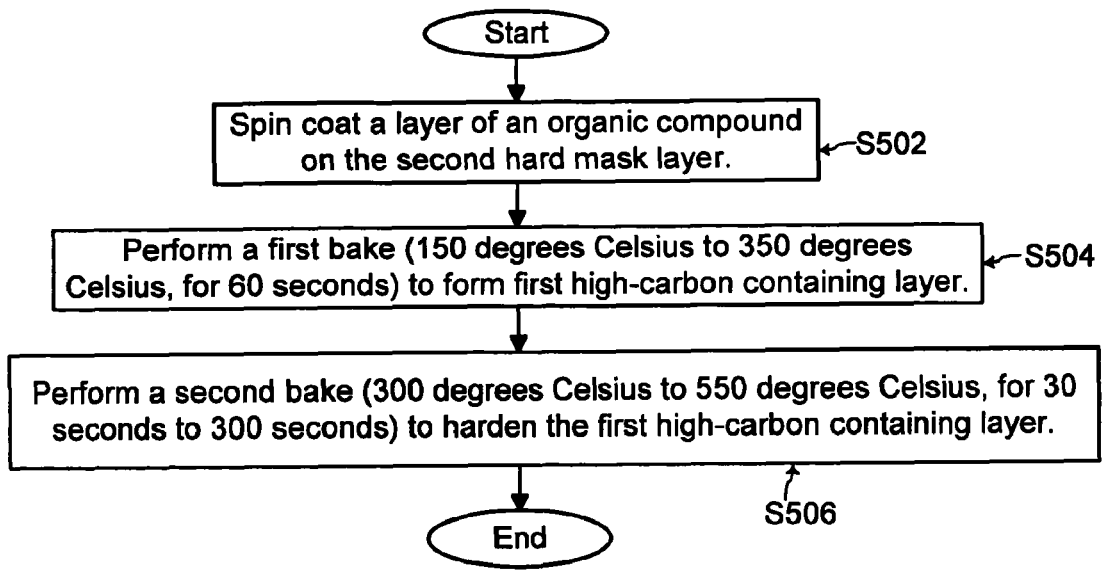
FIGS. 5 and 6 show flow-charts of steps for forming spin-coated layers comprised of hardened organic materials during patterning according to embodiments of the present invention.

The first spin-coated layer 210 is formed on the second hard mask layer 208 according to the steps of the flow-chart of FIG. 5, according to an example embodiment of the present invention. Referring to FIGS. 3A and 5, an organic compound material is spin-coated onto the second hard mask layer 208 with a thickness of from about 1,000 angstroms to about 1,500 angstroms in an example embodiment of the present invention (step S502 of FIG. 5). Subsequently, a first bake is performed for heating the organic compound material to a temperature of from about 150° Celsius to about 350° Celsius for about 60 seconds to form the first spin-coated layer 210 that is also a first high carbon containing layer (step S504 of FIG. 5). Such heating hardens the organic compound material of the first spin-coated layer 210.

Thereafter, a second bake is performed to further harden the first high carbon containing layer 210 by again heating the first high carbon containing layer 210 to a temperature of from about 300° Celsius to about 550° Celsius for from about 30 seconds to about 300 seconds (step S506 of FIG. 5). Such a second bake that further hardens the first high carbon containing layer 210 is advantageous for preventing adverse effects on the first high carbon containing layer 210 during subsequent high temperature processes performed at 400° Celsius or higher.

Figure 3B:
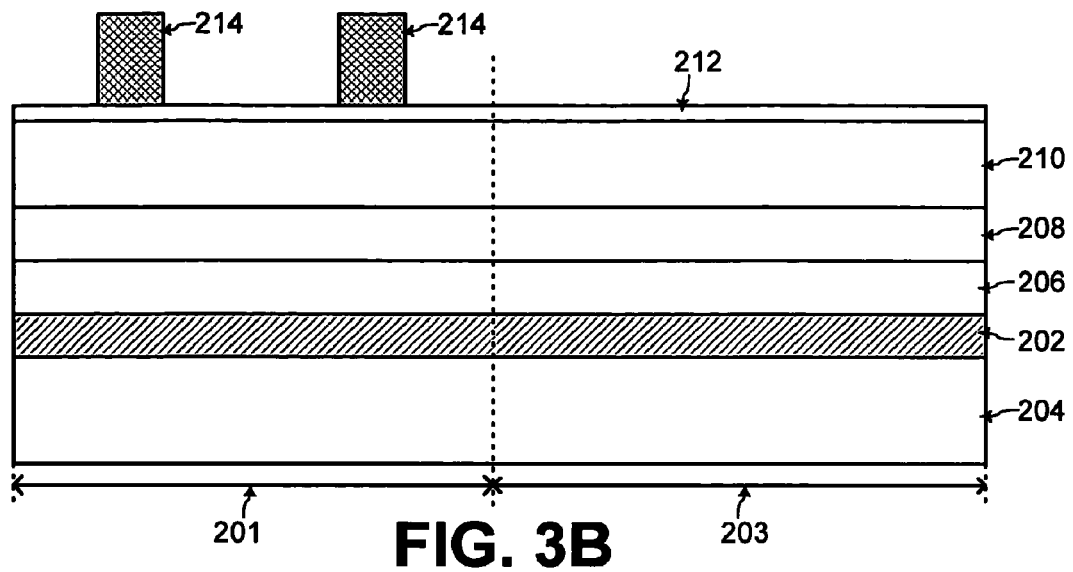

Also referring to FIG. 3B, an anti-reflective layer 212 is formed on the first high carbon containing layer 210. The anti-reflective layer 212 is comprised of silicon oxynitride (SiON) or a bottom anti-reflective coating (BARC) film in an example embodiment of the present invention. Further referring to FIG. 3B, photo-resist structures 214 are patterned on the anti-reflective layer 212 over the first area 201 of the semiconductor substrate 204 according to photolithography technology.

Figure 3C:
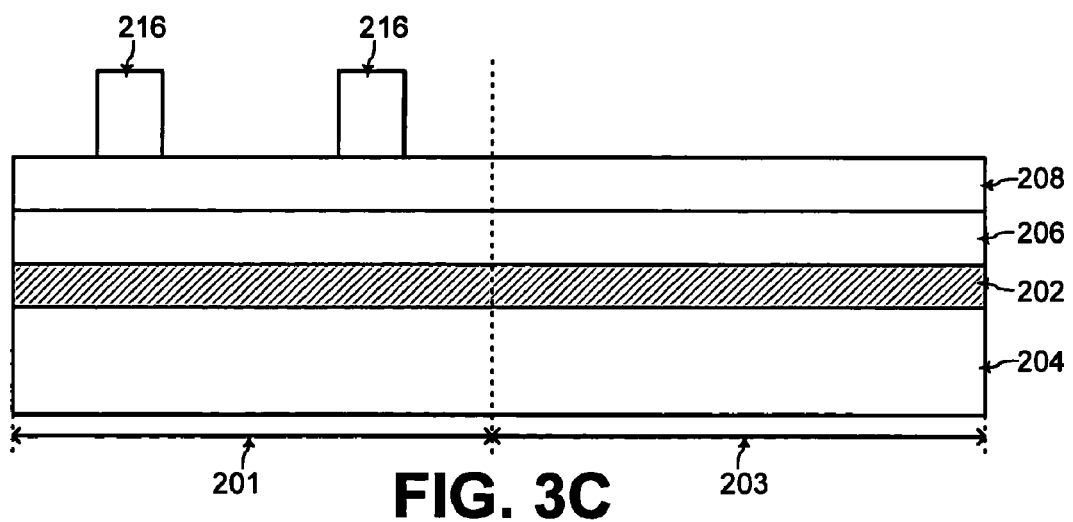

Subsequently referring to FIG. 3C, exposed portions of the anti-reflective layer 212 and the first high carbon containing layer 210 are anisotropically etched away to form spacer support structures 216 from the portions of the first high carbon containing layer 210 remaining under the photo-resist structures 214. Further referring to FIG. 3C, the photo-resist structures 214 and the anti-reflective layer 212 are completely removed in FIG. 3C.

Figure 3D:
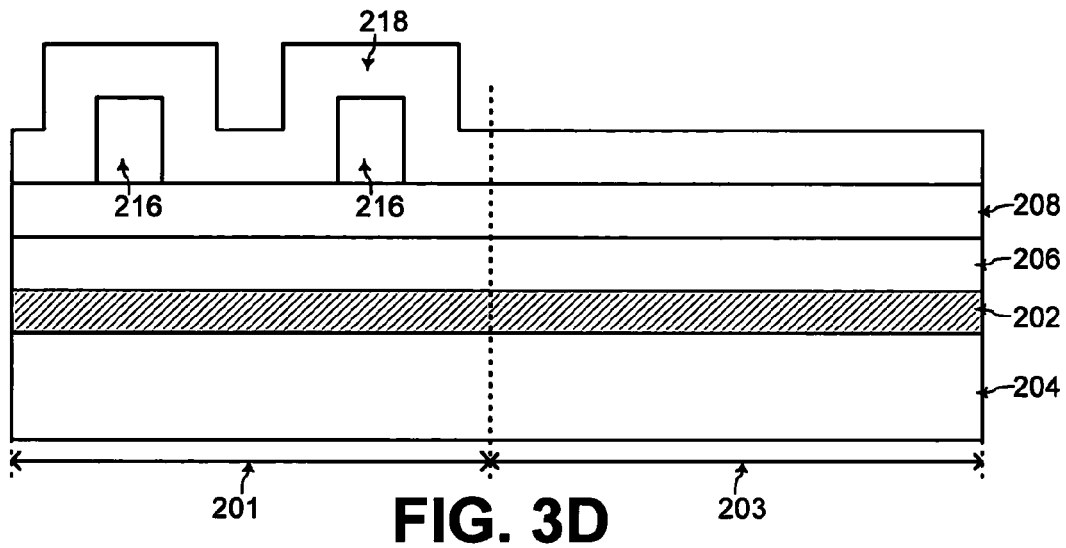

Thereafter referring to FIG. 3D, a layer of mask material 218 having a substantially uniform thickness is deposited on exposed surfaces of the spacer support structures 216 and the second hard mask layer 208. The mask material 218 is comprised of a material having different etch characteristics from the spacer support structures 216 and the second hard mask layer 208. For example, the mask material 218 is comprised of an oxide layer or a nitride layer formed by atomic layer deposition (ALD).

The mask material 218 is comprised of an oxide if the spacer support structures 216 are comprised of a high carbon containing material and the second hard mask layer 208 is comprised of a nitride. Alternatively, the mask material 218 is comprised of a nitride if the spacer support structures 216 are comprised of a high carbon containing material and the second hard mask layer 208 is comprised of an oxide.

Subsequently referring to FIG. 3E, a second spin-coated layer 220 which may also be termed a second mold layer is formed on the layer of mask material 218. In an example embodiment of the present invention, the second spin-coated layer 220 is comprised of a hydrocarbon compound including an aromatic ring or an organic compound comprising a derivative thereof. For example, the second spin-coated layer 220 is comprised of an organic compound having an aromatic ring such as phenyl, benzene, or naphthalene. In any case, the second spin-coated layer 220 is comprised of a high carbon containing material having from about 85% to about 99% weight percent of carbon, according to an example embodiment of the present invention.

Figure 6:
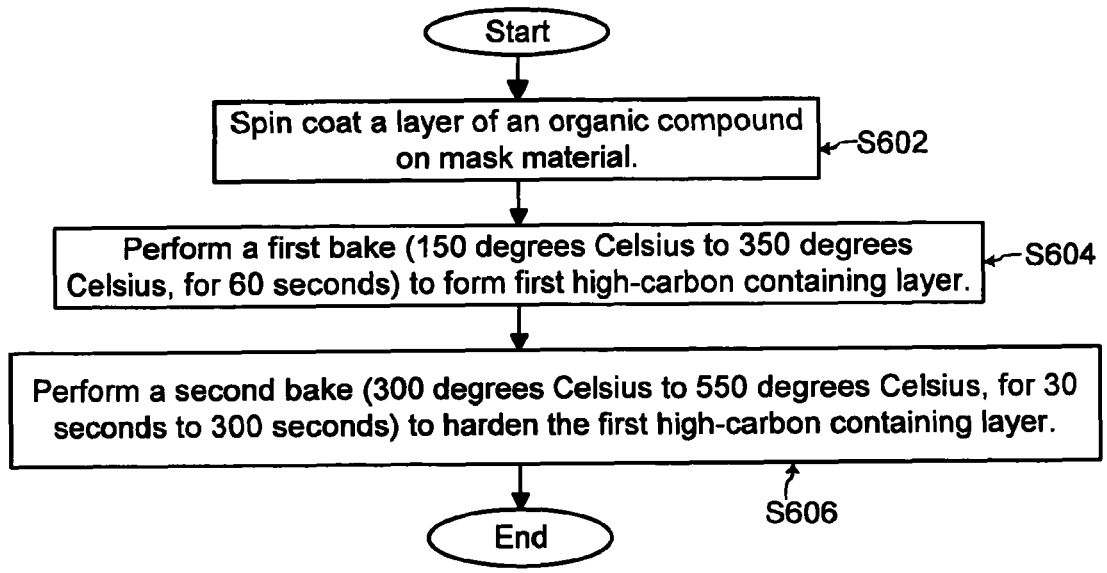

The second spin-coated layer 220 is formed on the mask material 218 according to the steps of the flow-chart of FIG. 6, according to an example embodiment of the present invention. Referring to FIGS. 3E and 6, an organic compound material is spin-coated onto the mask material 218 with a thickness of from about 1,000 angstroms to about 1,500 angstroms in an example embodiment of the present invention (step S602 of FIG. 6). Subsequently, a first bake is performed for heating the organic compound material to a temperature of from about 150° Celsius to about 350° Celsius for about 60 seconds to form the second spin-coated layer 222 that is also a second high carbon containing layer (step S604 of FIG. 6). Such heating hardens the organic compound material of the second spin-coated layer 220.

Thereafter, a second bake is performed to further harden the second high carbon containing layer 220 by again heating the second high carbon containing layer 220 to a temperature of from about 300° Celsius to about 550° Celsius for from about 30 seconds to about 300 seconds (step S606 of FIG. 6). Such a second bake that further hardens the second high carbon containing layer 220 is advantageous for preventing adverse effects on the second high carbon containing layer 220 during subsequent high temperature processes performed at 400° Celsius or higher.

Figure 3E:
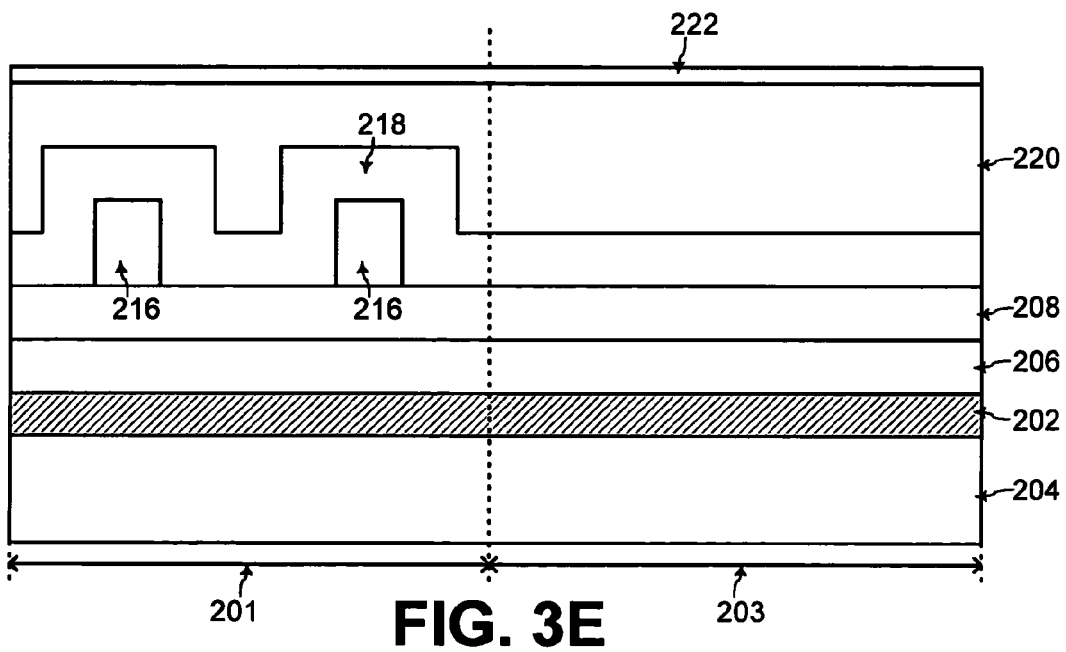

Also in FIG. 3E, an anti-reflective layer 222 is formed on the second high carbon containing layer 220. The anti-reflective layer 222 is comprised of silicon oxynitride (SiON) or a bottom anti-reflective coating (BARC) film in an example embodiment of the present invention.

Figure 3F:
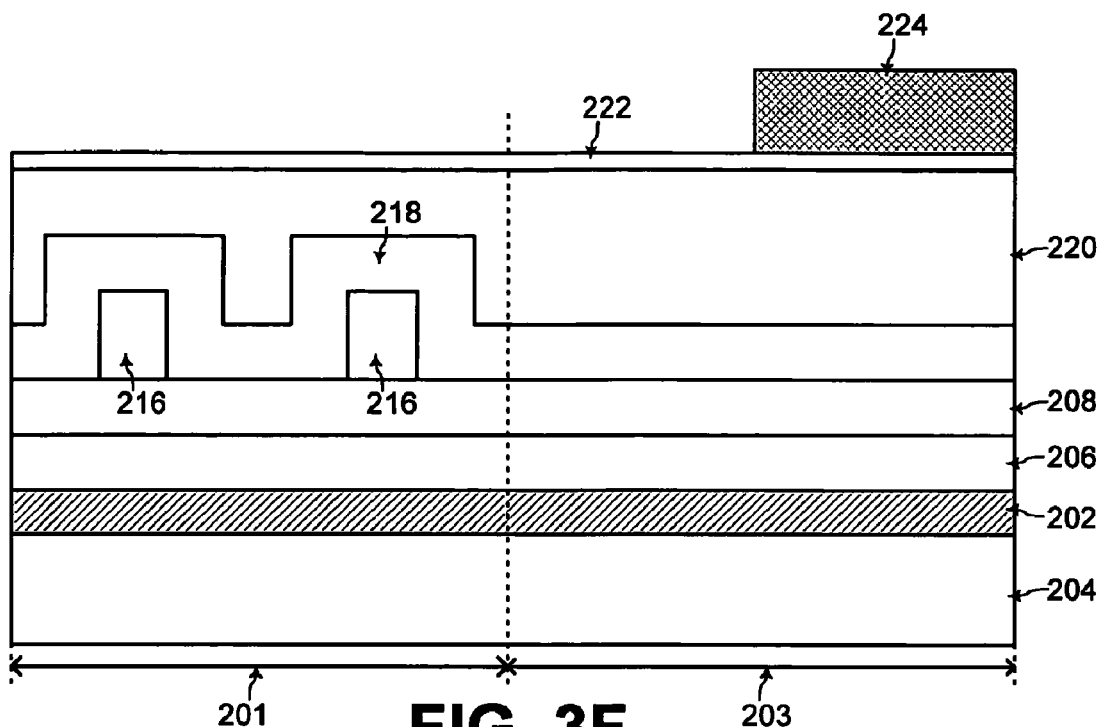
Figure 3G:
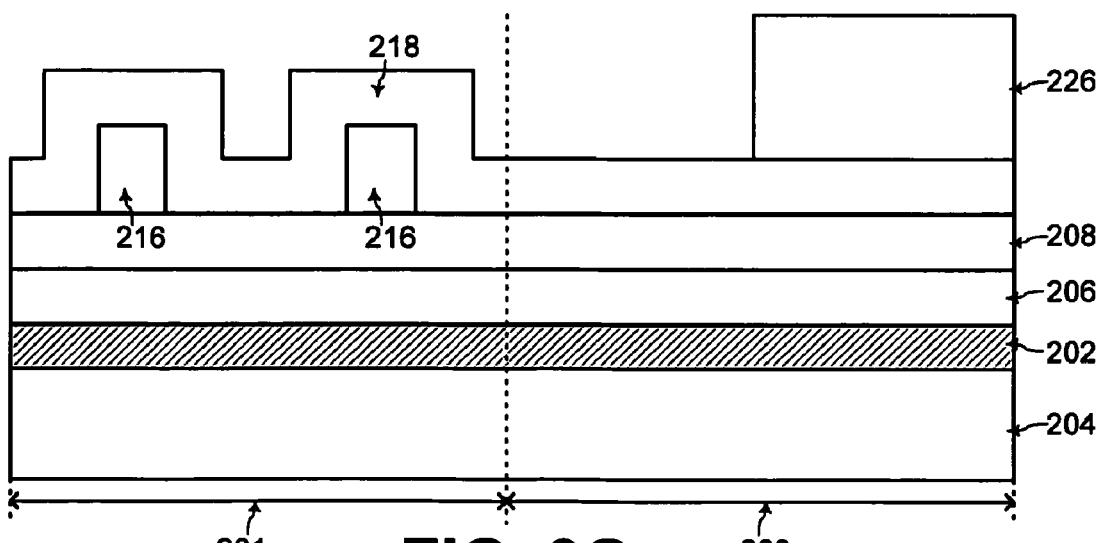

Thereafter referring to FIG. 3F, a photo-resist structure 224 is patterned on the anti-reflective layer 222 over the second area 203 of the semiconductor substrate 204 according to photolithography technology. Subsequently referring to FIG. 3G, exposed portions of the anti-reflective layer 222 and the second high carbon containing layer 220 are anisotropically etched away to form a masking structure 226 from the portion of the second high carbon containing layer 220 remaining under the photo-resist structure 224. Further referring to FIG. 3G, the photo-resist structures 224 and the anti-reflective layer 222 are also completely removed in FIG. 3G.

Subsequently referring to FIG. 3H, exposed portions of the mask material 218 are anisotropically etched away to form spacers 228 over the first area 201 and a mask pattern 230 over the second area 203. The spacers 228 are comprised of portions of the mask material 218 remaining at sidewalls of the spacer support structures 216. The mask pattern 230 is formed from the mask material 218 remaining under the masking structure 226 that acts as an etch mask. Thus in FIG.

3H, the spacers 228 and the mask pattern 230 are formed simultaneously from the mask material 218.

Figure 3H:
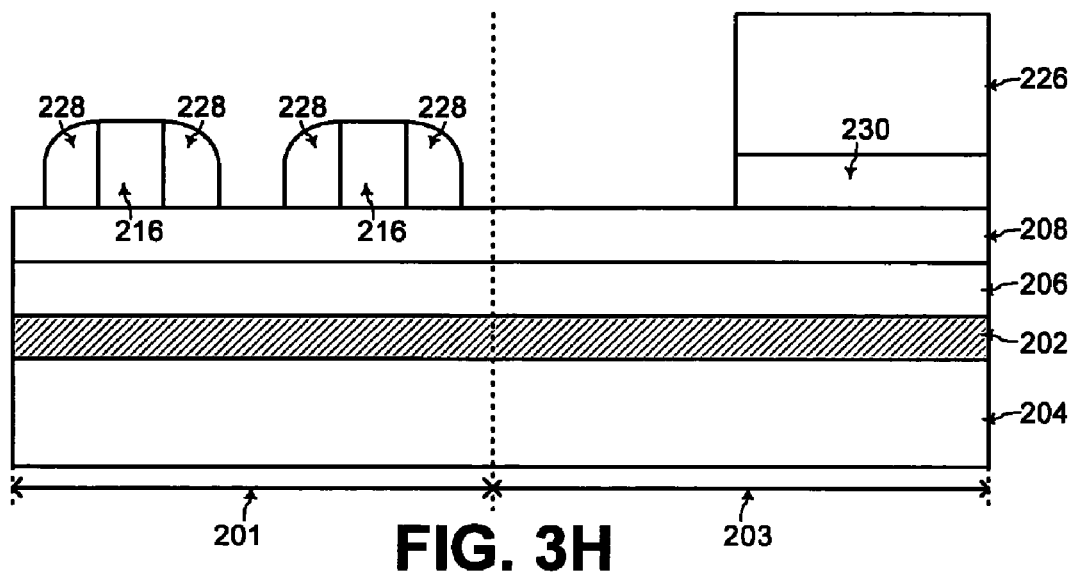
Figure 3I:
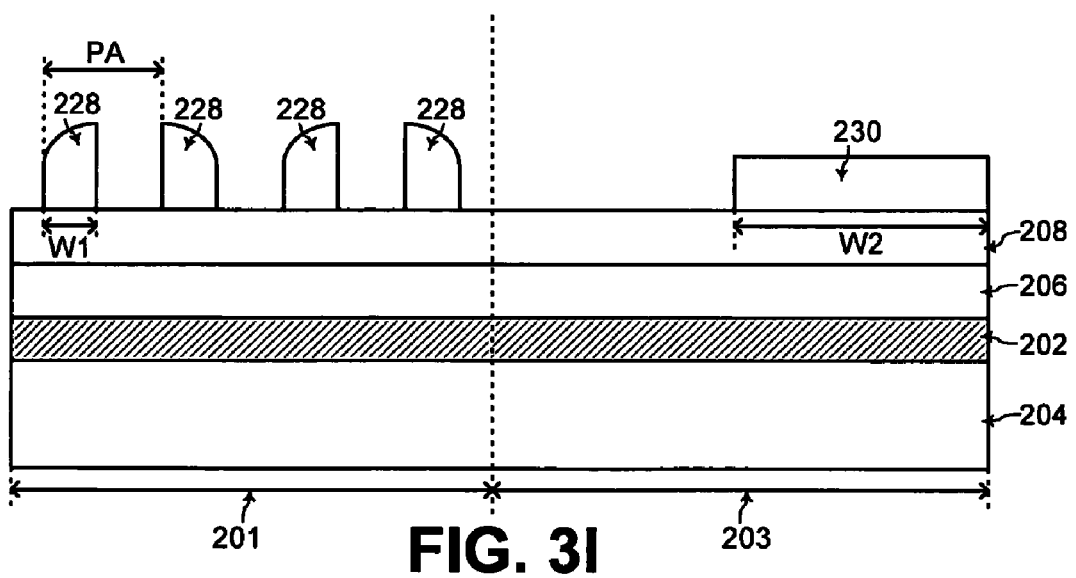

Thereafter referring to FIG. 3I, the spacer support structures 216 and the masking structure 226 are simultaneously etched away in one etch process. In an embodiment of the present invention, the spacer support structures 216 and the masking structure 226 are comprised of a same material having a same etch selectivity such that the spacer support structures 216 and the masking structure 226 are etched away simultaneously.

For example, when the spacer support structures 216 and the masking structure 226 are comprised of a same high carbon content material, an ashing and stripping process may be used for simultaneously removing the spacer support structures 216 and the masking structure 226. Ashing and stripping processes, individually and in general, are known to one of ordinary skill in the art of integrated circuit fabrication.

Further referring to FIG. 3I, each of the spacers 228 has a first width W1, and the mask pattern 230 has a second width W2 that is greater than the first width W1. The spacers 228 also have a relatively smaller pitch PA in the first area 201 than a pitch of the mask pattern 230 in the second area 203. Thus, integrated circuit structures with higher density are formed in the first area 201 than in the second area 203.

Figure 3J:
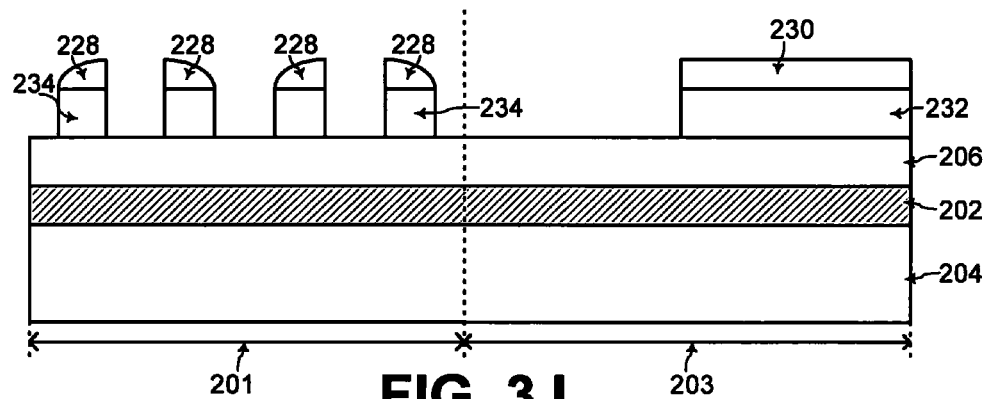

Subsequently referring to FIG. 3J, exposed portions of the second hard mask layer 208 are anisotropically etched away with the spacers 228 and the mask pattern 230 acting as an etch mask. Thus in FIG. 3J, upper high density hard mask structures 234 are formed from portions of the second hard mask layer 208 remaining under the spacers 228 in the first area 201. In addition in FIG. 3J, an upper low density hard mask structure 232 is formed from a portion of the second hard mask layer 208 remaining under the mask pattern 230 in the second area 203.

Figure 3K:
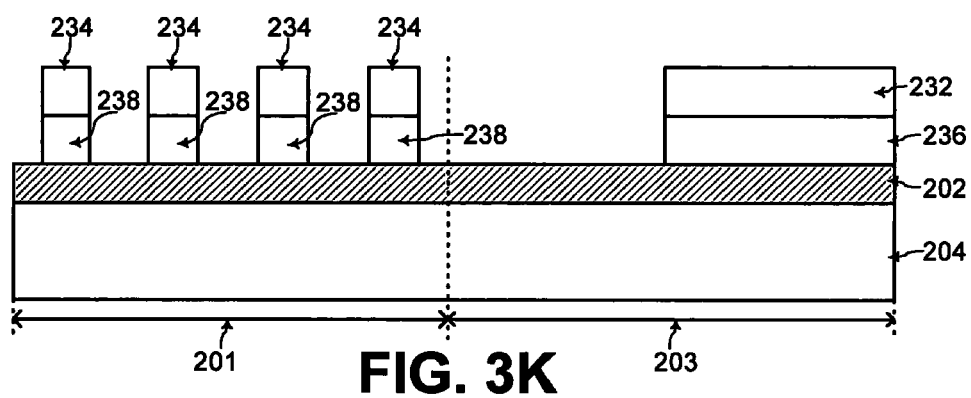

Thereafter referring to FIG. 3K, exposed portions of the first hard mask layer 206 are anisotropically etched away with the upper high density hard mask structures 234 and the upper low density hard mask structure 232 acting as an etch mask. Thus in FIG. 3K, lower high density hard mask structures 238 are formed from portions of the first hard mask layer 206 remaining under the upper high density hard mask structures 234 in the first area 201. In addition in FIG. 3K, a lower low density hard mask structure 236 is formed from a portion of the first hard mask layer 206 remaining under the upper low density hard mask structure 232 in the second area 203.

Subsequently referring to FIG. 3L, exposed portions of the target layer 202 are anisotropically etched away with the lower high density hard mask structures 238 and the lower low density hard mask structure 236 acting as an etch mask. Thus in FIG. 3L, high density integrated circuit structures 242 are formed from portions of the target layer 202 remaining under the lower high density hard mask structures 238 in the first area 201.

Figure 3L:
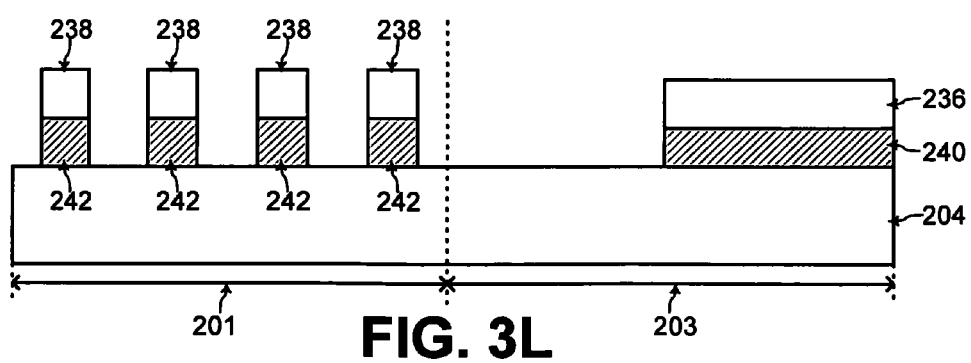

In addition in FIG. 3L, a low density integrated circuit structure 240 is formed from a portion of the target layer 202 remaining under the lower low density hard mask structure 236 in the second area 203. The present invention may also be practiced without the target layer 202. In that case, the lower high density hard mask structures 238 and the lower low density hard mask structure 236 would be used as an etch mask to etch the semiconductor substrate 204.

FIGS. 4A, 4B, 4C, 4D, 4E, 4F, and 4G show cross-sectional views during patterning a semiconductor substrate 304 using spacers and a mask pattern formed with use of spin coated high carbon content materials, according to a second embodiment of the present invention.

Figure 4A:
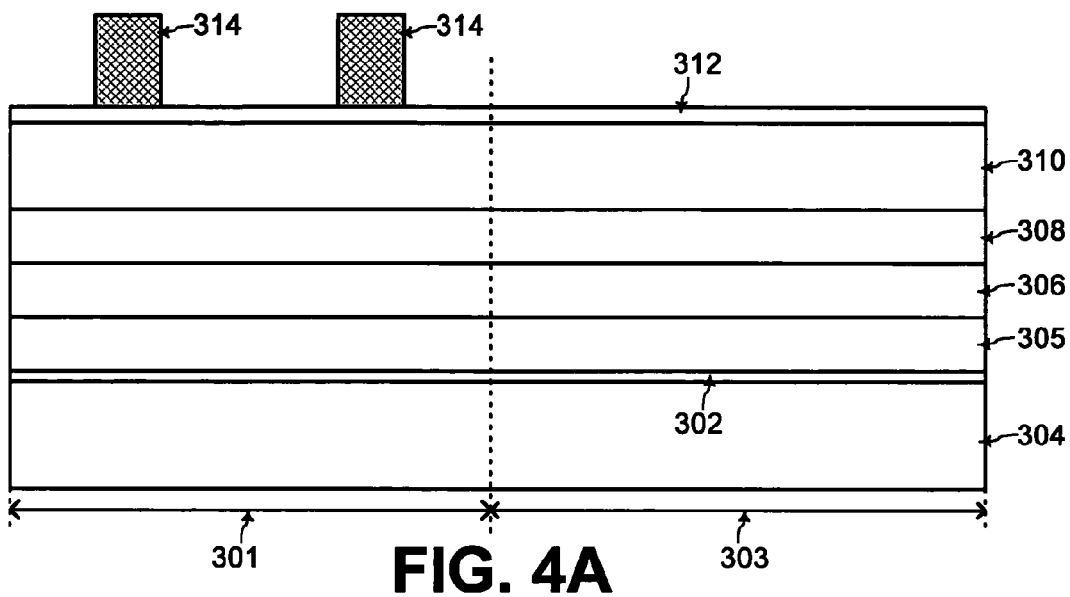
FIGS. 4A, 4B, 4C, 4D, 4E, 4F, and 4G show cross-sectional views during patterning a semiconductor substrate using spacers and a mask pattern formed with use of spin-coated high carbon content materials, according to a second embodiment of the present invention.

Referring to FIG. 4A, the semiconductor substrate 304 has a first area 301 for forming integrated circuit structures with higher density such as an array of memory cells of a memory device. Also in FIG. 4A, the semiconductor substrate 304 has a second area 303 for forming integrated circuit structures with lower density such as a periphery area having logic circuitry for the memory device.

Further referring to FIG. 4A, a pad oxide film 302 is deposited on the semiconductor substrate 204 such as a silicon substrate for example. In addition, a nitride film 305 is formed on the pad oxide film 302. Furthermore, a first hard mask layer 306 is formed on the nitride film 305, and a second hard mask layer 308 is formed on the first hard mask layer 306. A first spin-coated layer 310 is formed on the second hard mask layer 308, and an antireflective layer 312 is formed on the first spin-coated layer 310. Also referring to FIG. 4A, photo-resist structures 314 are formed on the antireflective layer 312 in the first area 301.

The photo-resist structures 314, the antireflective layer 312, the first spin-coated layer 310, the second hard mask layer 308, and the first hard mask layer 306 of FIG. 4A are similar to the photo-resist structures 214, the antireflective layer 212, the first spin-coated layer 210, the second hard mask layer 208, and the first hard mask layer 206, respectively, of FIG. 3B. For example, the first spin-coated layer 310 of FIG. 4A is formed according to the flow-chart of FIG. 5 to form the first high carbon containing layer 310.

Figure 4B:
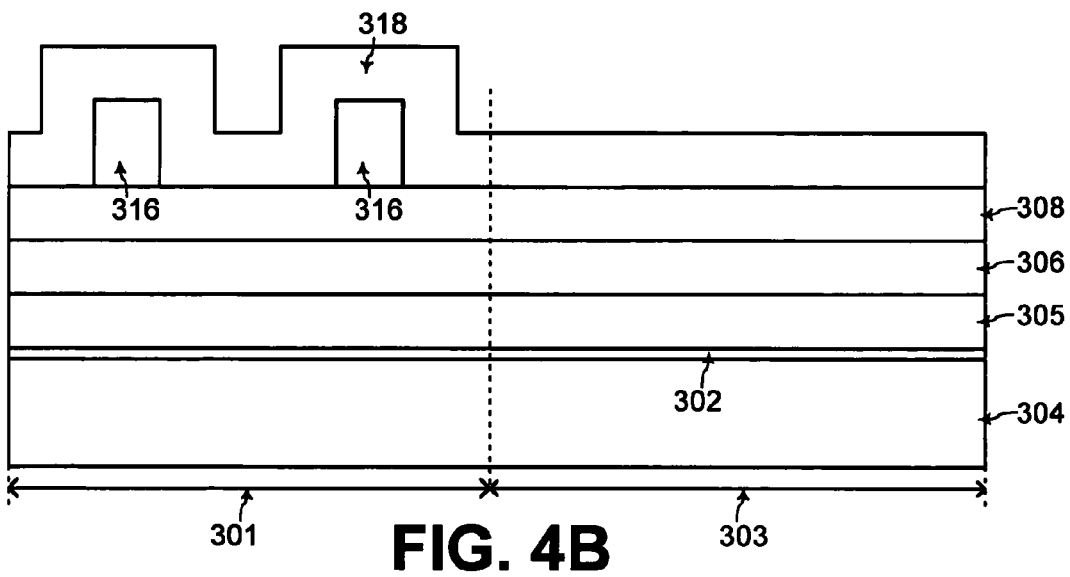

Subsequently referring to FIG. 4B, portions of the first high carbon containing layer 310 under the photo-resist structures 314 are patterned to form spacer support structures 316. In addition, a layer of mask material 318 having a substantially uniform thickness is deposited on exposed surfaces of the spacer support structures 316 and the second hard mask layer 308. The layer of mask material 318 of FIG. 4B is similar to the layer of mask material 218 of FIG. 3D.

Figure 4C:
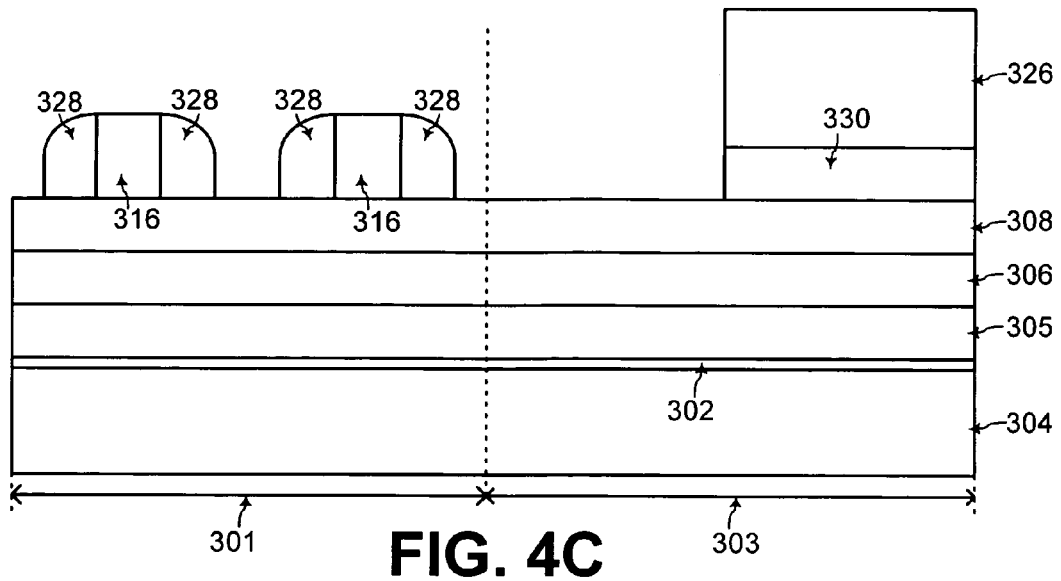

Thereafter referring to FIG. 4C, spacers 328 are formed from portions of the mask material 318 remaining on the sidewalls of the spacer support structures 316, similar to the spacers 228 of FIG. 3H. In addition in FIG. 4C, a mask pattern 330 is formed from a portion of the mask material 318 remaining under a masking structure 326, similar to the mask pattern 230 remaining under the masking structure 226 of FIG. 3H. For example, the masking structure 326 in FIG. 4C is formed from a second spin-coated layer formed according to the flow-chart of FIG. 6 for example.

Subsequently the spacer support structures 316 and the masking structure 326 comprised of respective high carbon content materials are etched away simultaneously in one etch process. Thereafter referring to FIG. 4D, portions of the first and second hard mask layers 306 and 308 remaining under the spacers 328 are patterned to form upper high density hard mask structures 334 and lower high density hard mask structures 338. In addition, portions of the first and second hard mask layers 306 and 308 remaining under the mask pattern 330 are patterned to form an upper low density hard mask structure 332 and a lower low density hard mask structure 336.

Figure 4D:
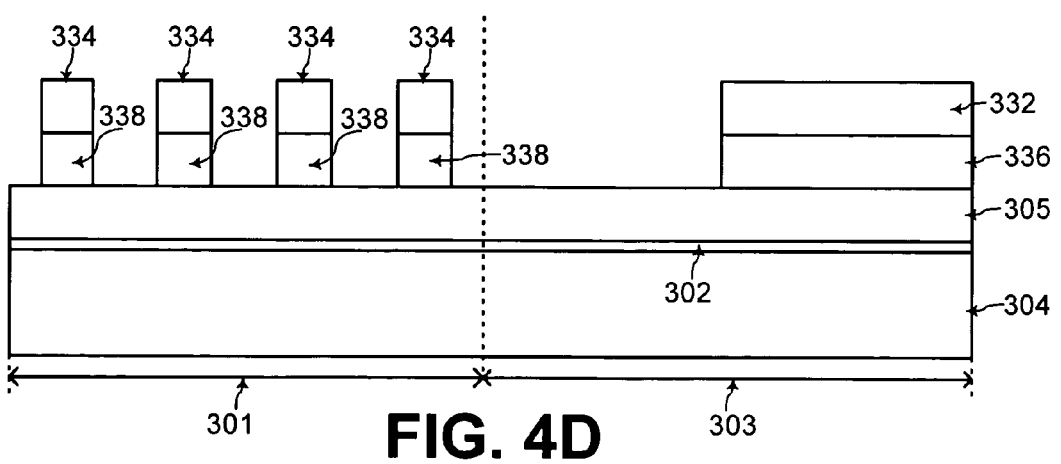
Figure 4E:
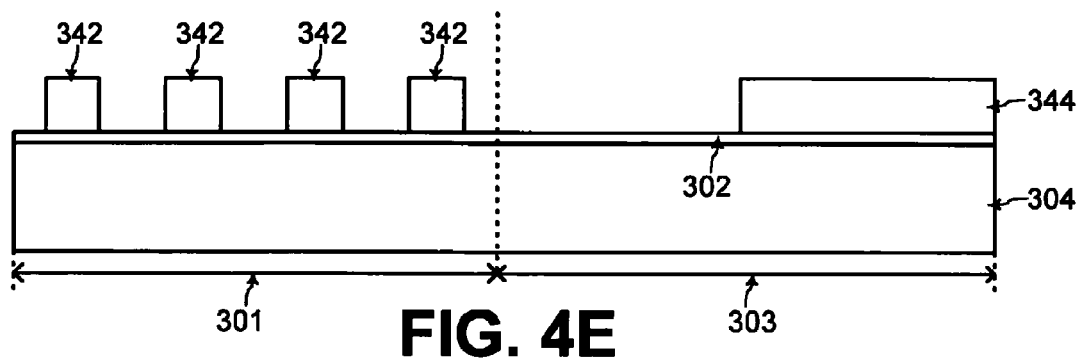
Figure 4F:
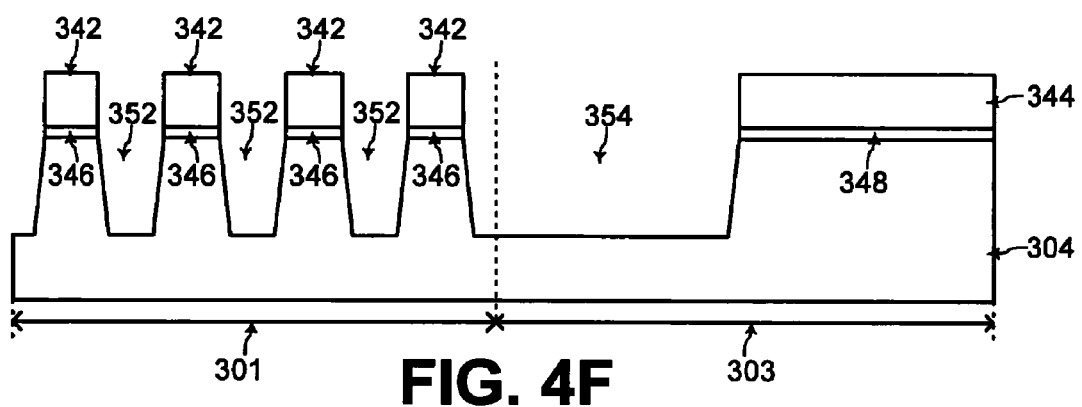
Figure 4G:
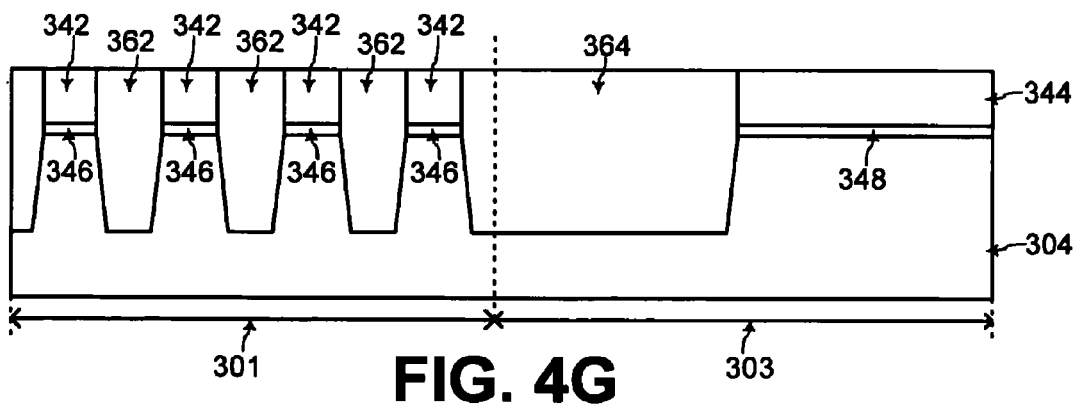

Thereafter referring to FIG. 4E, portions of the nitride film 305 remaining under the hard mask structures 338 and the hard mask structure 336 of FIG. 4D are patterned to form high density nitride structures 342 in the first area 301 and a low density nitride structure 344 in the second area 303. Subsequently referring to FIG. 4F, such nitride structures 342 and 344 are used as an etch mask to pattern the oxide film 302 and the semiconductor substrate 304.

Exposed portions of the oxide film 302 and the semiconductor substrate 304 are etched away to form high density openings 352 in the first area 301 and a low density opening 354 in the second area 303. Thereafter referring to FIG. 4G, an insulating material is formed to fill such openings 352 and 354 to form high density STI (shallow trench isolation) structures 362 in the first area 301 and a low density STI (shallow trench isolation) structure 364 in the second area 303.

In this manner, the spacers 228 or 328 are used as an etch mask for patterning the target layer 202 or the semiconductor substrate 304 to form integrated circuit structures with higher density in the first area 201 or 301. In addition, the mask pattern 230 or 330 is used as an etch mask for patterning the target layer 202 or the semiconductor substrate 304 to form integrated circuit structures with lower density in the second area 203 or 303.

In addition, the spacer support structures 216 or 316 and the masking structure 226 or 326 are comprised of respective high carbon content materials for being simultaneously etched away with ease in one ashing and stripping process. Furthermore, such high carbon content materials are formed by spin-coating for reduced void formation.

The foregoing is by way of example only and is not intended to be limiting. Thus, any dimensions or number of elements or any materials as illustrated and described herein are by way of example only. The present invention is limited only as defined in the following claims and equivalents thereof.

The invention claimed is:

1. A method of patterning during integrated circuit fabrication, the method comprising:
    forming at least one spacer support structure in a first area over a semiconductor substrate;
    depositing a mask material on exposed surfaces of the spacer support structure and on a second area over the semiconductor substrate;
    forming a masking structure on a portion of the mask material in the second area; and
    patterning the mask material to form spacers on sidewalls of the spacer support structure and to form a mask pattern under the masking structure,
    wherein the spacer support structure and the masking structure are comprised of respective materials having a substantially same etch selectivity.

2. The method of claim 1, wherein the spacer support structure and the masking structure are comprised of a substantially same material.

3. The method of claim 2, wherein the spacer support structure and the masking structure are each comprised of a respective high carbon content material having from about 85 weight percent to about 99 weight percent of carbon.

4. The method of claim 1, further comprising:
    etching away the spacer support structure and the masking structure during one etch process.

5. The method of claim 1, further comprising:
    patterning at least one target layer using the spacers and the mask pattern.

6. The method of claim 1, further comprising:
    patterning at least one hard-mask layer using the spacers and the mask pattern to form a hard-mask pattern.

7. The method of claim 6, further comprising:
    patterning at least one target layer using the hard-mask pattern.

8. The method of claim 7, wherein the at least one target layer includes the semiconductor substrate.

9. The method of claim 7, wherein the at least one target layer includes a conductive material.

10. The method of claim 1, wherein the spacer support structure and the masking structure are each comprised of a respective high carbon content material having from about 85 weight percent to about 99 weight percent of carbon.

11. The method of claim 10, wherein the step of forming the at least one spacer support structure includes:
    spin-coating an organic compound material over the semiconductor substrate;
    heating the organic compound material at a temperature of from about 300° Celsius to about 550° Celsius for from about 30 seconds to about 300 seconds to form a hardened organic compound layer; and
    patterning the hardened organic compound layer over the first area to form the at least one spacer support structure.

12. The method of claim 11, wherein the step of forming the at least one spacer support structure further includes:
    heating the organic compound material at a temperature of from about 150° Celsius to about 350° Celsius for about 60 seconds after the step of spin-coating the organic compound material.

13. The method of claim 11, wherein the hardened organic compound layer is patterned with a photo-resist pattern to form the at least one spacer support structure.

14. The method of claim 10, wherein the step of forming the masking structure includes:
    spin-coating an organic compound material on the mask material;
    heating the organic compound material at a temperature of from about 300° Celsius to about 550° Celsius for from about 30 seconds to about 300 seconds to form a hardened organic compound layer; and
    patterning the hardened organic compound layer over the second area to form the masking structure.

15. The method of claim 14, wherein the step of forming the masking structure includes:
    heating the organic compound material at a temperature of from about 150° Celsius to about 350° Celsius for about 60 seconds after the step of spin-coating the organic compound material.

16. The method of claim 15, wherein the hardened organic compound layer is patterned with a photo-resist pattern to form the masking structure.

17. The method of claim 1, wherein the first area of the semiconductor substrate is for fabricating an array of memory cells of a memory device, and wherein the second area of the semiconductor substrate forms a periphery area of the memory device.

18. A method of patterning during integrated circuit fabrication, the method comprising:
    forming at least one spacer support structure in a first area over a semiconductor substrate;
    depositing a mask material on exposed surfaces of the spacer support structure and on a second area over the semiconductor substrate;
    forming a masking structure on a portion of the mask material in the second area; and
    patterning the mask material to form spacers on sidewalls of the spacer support structure and to form a mask pattern under the masking structure,
    wherein at least one of the spacer support structure and the masking structure is formed from spin-coating a respective material.

19. The method of claim 18, wherein the spacer support structure and the masking structure are each comprised of a respective high carbon content material having from about 85 weight percent to about 99 weight percent of carbon.

20. The method of claim 19, wherein the step of forming the at least one spacer support structure includes:

spin-coating an organic compound material over the semiconductor substrate;

heating the organic compound material at a temperature of from about 300° Celsius to about 550° Celsius for from about 30 seconds to about 300 seconds to form a hardened organic compound layer; and patterning the hardened organic compound layer over the first area to form the at least one spacer support structure.

21. The method of claim 20, wherein the step of forming the at least one spacer support structure includes:

heating the organic compound material at a temperature of from about 150° Celsius to about 350° Celsius for about 60 seconds after the step of spin-coating the organic compound material.

22. The method of claim 20, wherein the hardened organic compound layer is patterned with a photo-resist pattern to form the at least one spacer support structure.

23. The method of claim 19, wherein the step of forming the masking structure includes:

spin-coating an organic compound material on the mask material;

heating the organic compound material at a temperature of from about 300° Celsius to about 550° Celsius for from about 30 seconds to about 300 seconds to form a hardened organic compound layer; and patterning the hardened organic compound layer over the second area to form the masking structure.

24. The method of claim 23, wherein the step of forming the masking structure further includes:

heating the organic compound material at a temperature of from about 150° Celsius to about 350° Celsius for about 60 seconds after the step of spin-coating the organic compound material.

25. The method of claim 23, wherein the hardened organic compound layer is patterned with a photo-resist pattern to form the masking structure.

* * * * *